United States Patent [19]
Rice et al.

[11] Patent Number: 5,677,923
[45] Date of Patent: Oct. 14, 1997

[54] VERTICAL CAVITY ELECTRON BEAM PUMPED SEMICONDUCTOR LASERS AND METHODS

[75] Inventors: Robert R. Rice, Chesterfield; Neil F. Ruggieri, Florissant, both of Mo.; James F. Shanley, Milford, Mass.

[73] Assignee: McDonnell Douglas Corporation, St. Louis, Mo.

[21] Appl. No.: 584,543

[22] Filed: Jan. 11, 1996

[51] Int. Cl.⁶ .............................. H01S 3/19; H01S 3/09
[52] U.S. Cl. .............................................. 372/74; 372/43
[58] Field of Search ........................................ 372/74, 43

[56] References Cited

U.S. PATENT DOCUMENTS

| | | | |
|---|---|---|---|
| 3,692,572 | 9/1972 | Strehlow | 117/201 |
| 3,757,250 | 9/1973 | Packard et al. | 331/94.5 |
| 3,864,645 | 2/1975 | Packard et al. | 331/94.5 H |
| 4,539,687 | 9/1985 | Gordon et al. | 372/43 |
| 4,695,332 | 9/1987 | Gordon et al. | 437/126 |
| 4,894,832 | 1/1990 | Colak | 372/44 |
| 5,081,632 | 1/1992 | Migita et al. | 372/45 |
| 5,254,502 | 10/1993 | Kozlovsky | 437/225 |
| 5,280,360 | 1/1994 | Derdyra et al. | 358/242 |
| 5,283,798 | 2/1994 | Kozlovsky et al. | 372/45 |
| 5,313,483 | 5/1994 | Kozlovsky et al. | 372/15 |
| 5,317,583 | 5/1994 | Nasibov et al. | 372/43 |
| 5,339,003 | 8/1994 | Kozlovsky et al. | 313/463 |
| 5,374,870 | 12/1994 | Akhekyan et al. | 313/463 |

FOREIGN PATENT DOCUMENTS

| | | |
|---|---|---|
| 1803154 | 3/1993 | Russian Federation . |
| 2032242 | 4/1994 | Russian Federation . |
| 2032247 | 3/1995 | Russian Federation . |
| 2032258 | 3/1995 | Russian Federation . |
| 2032246 | 4/1995 | Russian Federation . |
| WO 9406180 | 3/1994 | WIPO . |

OTHER PUBLICATIONS

O.V. Bogdankevich, *Electron–beam–pumped semiconductor lasers*, Quantum Electronics 24 (12), 1994 Kvantovaya Elektronika and Turpion Ltd, pp. 1031–1053. (No Month).

M. Asif Khan et al., *Vertical–cavity, room–temperature stimulated emission from photopumped GaN films deposited over sapphire substrates using low–pressure metalorganic chemical vapor deposition*, Appl. Phys. Lett. 58 (14), 8 Apr. 1991, pp. 1515–1517.

Scott W. Corzine et al., *Design of Fabry–Perot Surface–Emitting Lasers with a Periodic Gain Structure*, IEEE Journal of Quantum Electronics, vol. 25, No. 6, Jun. 1989, pp. 1513–1524.

Sadao Adachi, *Optical properties of $Al_xGa_{1-x}$ As Alloys*, Physical Review B, vol. 38, No. 17, Dec. 15, 1988-I, pp. 12345–12352.

R. Geels et al., *WM1 Analysis and design of a novel parallel–driven MQW–DBR surface–emitting diode laser*, Semiconductor Diode Lasers, Poster Session: 2, CLEO '88/Wednesday Poster/206, Apr. 27, 1988 Pacific Ballroom A/B.

(List continued on next page.)

*Primary Examiner*—James W. Davie
*Attorney, Agent, or Firm*—Bell, Seltzer, Park & Gibson, P.A.

[57] ABSTRACT

An electron beam pumped semiconductor laser includes a semiconductor laser screen and an electron beam source adjacent the semiconductor laser screen. The semiconductor laser screen comprises a transparent single crystal substrate, an electron beam responsive active gain layer on the substrate, and first and second reflective layers. The epitaxial electron beam responsive active gain layer has a crystal structure in alignment with the crystal structure of the substrate, and the first and second reflective layers define a laser cavity through the epitaxial electron beam responsive active gain layer therebetween. The electron beam source generates an electron beam which impinges on the epitaxial electron beam responsive active gain layer thereby generating a laser output. Accordingly, the single crystal active gain layer can be formed on the substrate by epitaxial deposition techniques increasing the performance and reliability of the electron beam pumped semiconductor laser.

20 Claims, 7 Drawing Sheets

OTHER PUBLICATIONS

O.V. Bogdankevich et al., *Distribution of the excitation density in electron–beam–pumped semiconductor lasers*, Sov. J. Quantum Electron. 13 (11), Nov. 1983, pp. 1453–1459.

U. Levy et al., *Laser Cathode Ray Tube with a Semiconductor Double–Heterostructure Screen*, IEEE Electron Device Letters, vol. EDL–4, No. 5, May 1983, pp. 155–156.

O.V. Bogdankevich, *The Use of Electron–Beam Pumped Semiconductor Lasers in Projection Television*, IEEE Journal of Quantum Electronics, vol. QE–14, No. 2, Feb. 1978, pp. 133–135.

O.V. Bogdankevich et al., *Application of Electron Beam Pumped Semiconductor Lasers to Projection Television*, IEEE Journal of Quantum Electronics, vol. 13, No. 9 (Sep. 1977), p. 65D.

C.E. Hurwitz, *High Power and Efficiency in CdS Electron Beam Pumped Lasers*, Applied Physics Letters, vol. 9, No. 12, Dec. 15, 1966, pp. 420–423.

J. William Doane et al., *WTEC Panel on Display Technologies In Russia, Ukraine, and Belarus*, World Technology Evaluation Center, Draft Report, Jul. 1994.

VERTICAL CAVITY ELECTRON BEAM PUMPED SEMICONDUCTOR LASERS AND METHODS

GOVERNMENT RIGHTS

This invention was made with government support under Contract No. DABT 63-93-C-0047 awarded by the Advanced Research Projects Agency. Accordingly, the government may have certain rights in this invention.

FIELD OF THE INVENTION

This invention relates to semiconductor lasers, and more particularly to electron beam pumped semiconductor lasers.

BACKGROUND OF THE INVENTION

Electron beam pumped semiconductor lasers have been considered for use in high brightness, high resolution laser projection applications. For example, electron beam pumped semiconductor lasers could be used in applications such as flight simulator visuals, large screen projection, cockpit display, electronic cinema, teleconferencing, auditorium display, laser microscopy, optical computing, and theme park laser displays. In such applications, the electron beam pumped semiconductor laser is essentially a cathode ray tube in which the phosphor screen has been replaced by a single crystal layer of a direct band gap semiconductor.

When the scanned electron beam impinges on the semiconductor layer (also known as the laser screen), it is excited to produce laser radiation, which is emitted in a direction perpendicular to the surface of the crystal. Accordingly, if the surface of the semiconductor layer is imaged by an appropriate projection lens on a large screen, a bright image can be produced at high resolution.

In a conventional laser screen, a single crystal of a II–IV semiconductor is grown and then cut into circular wafers of 50–70 mm diameter and 300–500 μm thickness. One surface of each wafer is polished and bonded to a polished sapphire substrate approximately 1 cm thick. The single crystal wafer is thinned to about 10–20 μm while attempting to obtain a smooth surface and uniform wafer thickness. The upper surface of the wafer is then coated with a thin layer of silver to provide an optical reflector as well as an electron beam current return path. This laser screen is attached to the body of a cathode ray tube which is evacuated for operation.

Due to the thickness of the single crystal, this laser screen may require an operating electron beam voltage of 65–75 kV. This high electron beam voltage may result in high temperature operation reducing the lifetime of the laser, and the need for cryogenic cooling. The high electron beam voltage may also lead to x-ray generation requiring that the laser be shielded and certified. In addition, uniformity of the wafer thickness may be difficult to obtain during the thinning step as parallelism between the polishing surface used to thin the wafer and the wafer itself may be difficult to maintain thereby resulting in undesirable variations in the laser output as it is scanned across the screen. Furthermore, the size of the laser screen is limited by the size of the single crystal wafer which can be grown. Moreover, this laser screen may be expensive to produce because of the labor intensive operations required and low yields.

The reference by C. E. Hurwitz entitled *"High Power And Efficiency In CdS Electron Beam Pumped Lasers"* discusses the electron beam excitation of CdS crystals. The thin CdS crystal platelets were grown from CdS powder by vapor transport, and rectangular laser samples were cleaved from the platelets and mounted on the cold finger of a Dewar with vacuum grease or pure indium solder. Although laser emission was observed at incident electron energies as low as 11 keV, substantial output power and efficiency were obtained only for energies in excess of about 40 keV.

The reference by U. Levy et al. entitled *"Laser Cathode Ray Tube With A Semiconductor Double-Heterostructure Screen"* discusses a cathode ray tube in which the target screen is a (GaAs)(GaAlAs) double-heterostructure (DH) single-crystal semiconductor. The authors report room temperature laser action wherein the light-beam is normal to the face of the tube allowing scanning in two dimensions. In particular, the target was a (GaAs)(GaAlAs) DH grown on a GaAs substrate, and a thick layer of GaAlAs was grown last. A layer of gold was deposited on the sample which was epoxied face down on a sapphire disk. The GaAs substrate was selectively etched away, and the target was bombarded with 34 keV electrons.

Conventional electron beam semiconductor lasers with bonded layers, however, may require high operating voltages for the electron beam resulting in the need for cryogenic cooling, a limited lifetime, and undesirable x-ray generation requiring shielding. Furthermore, any non-uniformity of the crystal or adhesive bond may produce undesirable brightness variations across the semiconductor layer. In addition, the manufacturing process including the production and bonding of the semiconductor layer may be costly and labor intensive as well as result in relatively low yields. Accordingly, there continues to exist a need in the art for efficient methods for fabricating electron beam pumped semiconductor lasers having low operating voltages, reduced x-ray generation, and an extended operational lifetime.

SUMMARY OF THE INVENTION

It is therefore an object of the present invention to provide improved methods for fabricating electron beam pumped semiconductor lasers.

It is another object of the present invention to provide improved electron beam pumped semiconductor lasers having relatively low operating voltages.

These and other objects are provided according to the present invention by providing a semiconductor laser screen wherein an electron beam responsive active gain layer is epitaxially formed on a single crystal substrate so that the active gain layer has a crystal structure in alignment with the substrate. In addition, the laser screen includes first and second reflective layers defining a laser cavity through the active gain layer therebetween.

Accordingly, a thin active gain layer can be formed thereby reducing the electron beam voltage required to generate a laser output. This active gain layer can be formed with uniform thickness and composition resulting in a laser output which can be scanned across the screen with uniform intensity and wavelength responsive to a scanned electron beam. In addition, the epitaxial bond between the active gain layer and the substrate reduces the risk of contamination and increases the integrity of the laser screen.

According to a first aspect of the present invention, a semiconductor laser screen generates a laser output in response to an electron beam impinging thereon. This laser screen includes a single crystal substrate, an epitaxial electron beam responsive active gain layer on the substrate, and first and second reflective layers. The substrate has a predetermined crystal structure, and the active gain layer has a crystal structure in alignment with the predetermined crystal structure of the substrate. The first reflective layer is on the active gain layer opposite the single crystal substrate, and the second reflective layer is on the single crystal substrate thereby defining a laser cavity through the epitaxial active gain layer between the first and second reflective layers.

The second reflective layer is preferably an epitaxial reflective layer between the single crystal substrate and the epitaxial active gain layer, wherein the epitaxial reflective layer has a crystal structure in alignment with the predetermined crystal structure of the substrate. The epitaxial reflective layer provides a growth surface on which the active gain layer can be deposited. Accordingly, both the epitaxial reflective layer and the active gain layer can be formed by epitaxial deposition thereby reducing the number of processing steps.

In particular, the epitaxial reflective layer can include a Bragg reflector with alternating layers of high and low refractive index. The Bragg reflector can be formed from single crystal materials which have a relatively close lattice match with both the substrate and the active gain layer thereby facilitating epitaxial growth.

In addition, the laser screen can include an anti-reflective layer on the single crystal substrate opposite the second reflective layer. This layer reduces the reflection of the output laser back into the laser screen. The laser screen can also include a lattice matching growth layer between the single crystal substrate and second reflective layer. This layer can be used to reduce any crystal lattice mis-match between the substrate the epitaxial reflective layer.

Alternately, the second reflective layer can be on the single crystal substrate opposite the epitaxial active gain layer. Accordingly, the epitaxial active gain layer can be grown directly on the substrate thereby eliminating the need to use a material for the second reflective layer with a crystal lattice which matches that of either the substrate or the active gain layer. With the second reflective layer on the substrate opposite the active gain layer, the second reflective layer is not even required to be crystalline.

The epitaxial active gain layer can be a uniform single crystal, or it can include a plurality of quantum wells. In addition, the laser screen can include a conductive annular edge contact on the first reflective layer opposite the epitaxial active gain layer extending along an outer portion of the laser screen. This edge contact enhances the ability of the laser screen to dissipate the electron beam current without significantly interfering with the ability of the electron beam to penetrate the active gain layer.

Preferably, the electron beam impinges on the first reflective layer and the active gain layer, the single crystal substrate is transparent to the laser output, and the second reflective layer is partially transmitting. In this arrangement, the laser output exits the semiconductor laser screen opposite the electron beam. This arrangement allows the placement of the electron beam source on one side of the laser screen opposite the side from which the laser output is transmitted. Accordingly, the electron beam source does not interfere with the laser output.

According to another aspect of the present invention, an electron beam pumped semiconductor laser includes a semiconductor laser screen and an electron beam source adjacent the semiconductor laser screen. The semiconductor laser screen comprises a single crystal substrate, an electron beam responsive active gain layer on the substrate, and first and second reflective layers. The epitaxial electron beam responsive active gain layer has a crystal structure in alignment with the crystal structure of the substrate, and the first and second reflective layers define a laser cavity through the epitaxial electron beam responsive active gain layer therebetween. The electron beam source generates an electron beam which impinges on the epitaxial electron beam responsive active gain layer thereby generating a laser output.

Still another aspect of the present invention is a method of fabricating an electron beam pumped semiconductor laser. According to this method, an electron beam responsive active gain layer is epitaxially formed on a single crystal substrate so that the active gain layer has a crystal structure in alignment with the crystal structure of the substrate. A first reflective layer is formed on the epitaxial electron beam responsive active gain layer opposite the single crystal substrate, and a second reflective layer is formed on the single crystal substrate thereby defining a laser cavity through the epitaxial electron beam responsive active gain layer between the first and second reflective layers. In addition, an electron beam source is provided adjacent the first reflective layer opposite the single crystal substrate for generating an electron beam to impinge on the epitaxial electron beam responsive active layer thereby generating a laser output.

The semiconductor laser of the present invention includes an epitaxial electron beam responsive active gain layer with a crystal structure in alignment with the crystal structure of the substrate of the laser screen. Accordingly, the active gain layer can be grown directly on the substrate by epitaxial growth techniques known in the art allowing the production of thin active gain layers with uniform thickness and composition over relatively large areas. This epitaxial active gain layer can adhere firmly to the substrate without the need for adhesives or other bonding materials which may not stand up to heat or electron bombardment. Accordingly, the semiconductor laser of the present invention can be operated at low electron beam voltages, and operated over an extended lifetime. In addition, the elimination of wafer bonding, etching, polishing, and lapping reduce the risk of contamination as well as the costs of production.

DETAILED DESCRIPTION OF A PREFERRED EMBODIMENT

Figure 1:
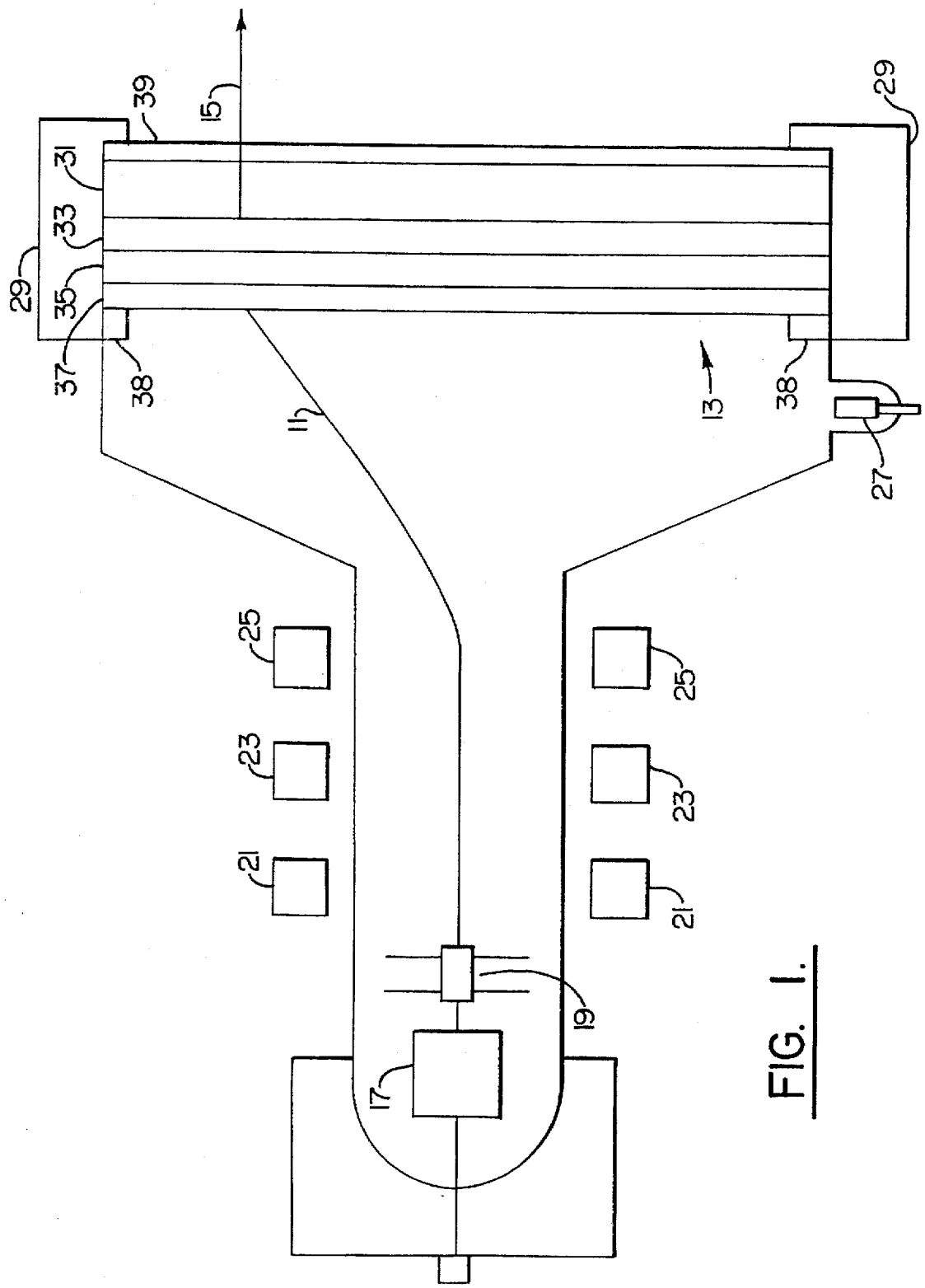
FIG. 1 is a side view of an electron beam pumped semiconductor laser according to the present invention.

The present invention will now be described more fully hereinafter with reference to the accompanying drawings, in which a preferred embodiment of the invention is shown.

This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings, the thickness of the layers and regions are exaggerated for clarity. Like numbers refer to like elements throughout.

An electron beam pumped semiconductor laser according to the present invention is illustrated in FIG. 1. As shown, an electron beam 11 is generated and accelerated to impinge the semiconductor laser screen 13 thereby generating an output laser beam 15. The electron beam 11 is generated by the electron gun 17 in combination with the bias and acceleration grid 19. The electron beam 11 is scanned across the semiconductor laser screen 13 under control of the focus yokes 21, alignment yokes 23, and X-Y deflection yokes 25. In addition, the semiconductor laser can include a vacuum pump 27, such as an ion pump, for maintaining a vacuum within the electron beam path, as well as a cooling manifold 29 for cooling the laser screen 13.

The laser screen includes a single crystal substrate 31, an epitaxial partially reflecting/transmitting layer 33, an epitaxial electron beam responsive active gain layer 35, and a highly reflective layer 37 on the active gain layer. Accordingly, the two reflective layers 33 and 37 define a laser cavity therebetween through the epitaxial active gain layer 35, and the incident electron beam 11 generates a laser beam output 15 at the point of impingement. In particular, the highly reflective layer 37 is thin enough that the electron beam 11 is not significantly impeded allowing it to be absorbed by the electron beam responsive active gain layer 35.

The active gain layer 35 provides optical gain at the output laser wavelength. This gain is produced by the optically stimulated recombination of carriers that have been produced by electron beam bombardment. The recombination can be band-to-band, excitonic, donor-to-valence band, acceptor-to-conduction band, or donor-to-acceptor. The active gain layer 35 can be a uniform single crystal layer with a thickness ranging from 1 µm to 20 µm, or the active gain layer can include stacks of quantum wells with barrier layers and resonant periodic media in which isolated quantum wells are positioned at the antinodes of the standing wave optical field in the laser cavity. The use of quantum wells provides the benefit of higher net gain and higher temperature operation.

Furthermore, because the partially reflecting/transmitting layer 33 is adjacent the active gain layer 35 opposite the electron beam 11, the laser beam 15 is transmitted out of the laser screen 13 opposite the electron beam 11. In addition, the laser screen 13 can include an anti-reflective coating 39 on the substrate 31 opposite the active gain layer 35 to reduce reflection of the laser beam 16 back into the laser screen 13. Various arrangements of these layers are illustrated in greater detail in FIGS. 2 and 3.

Figure 2:
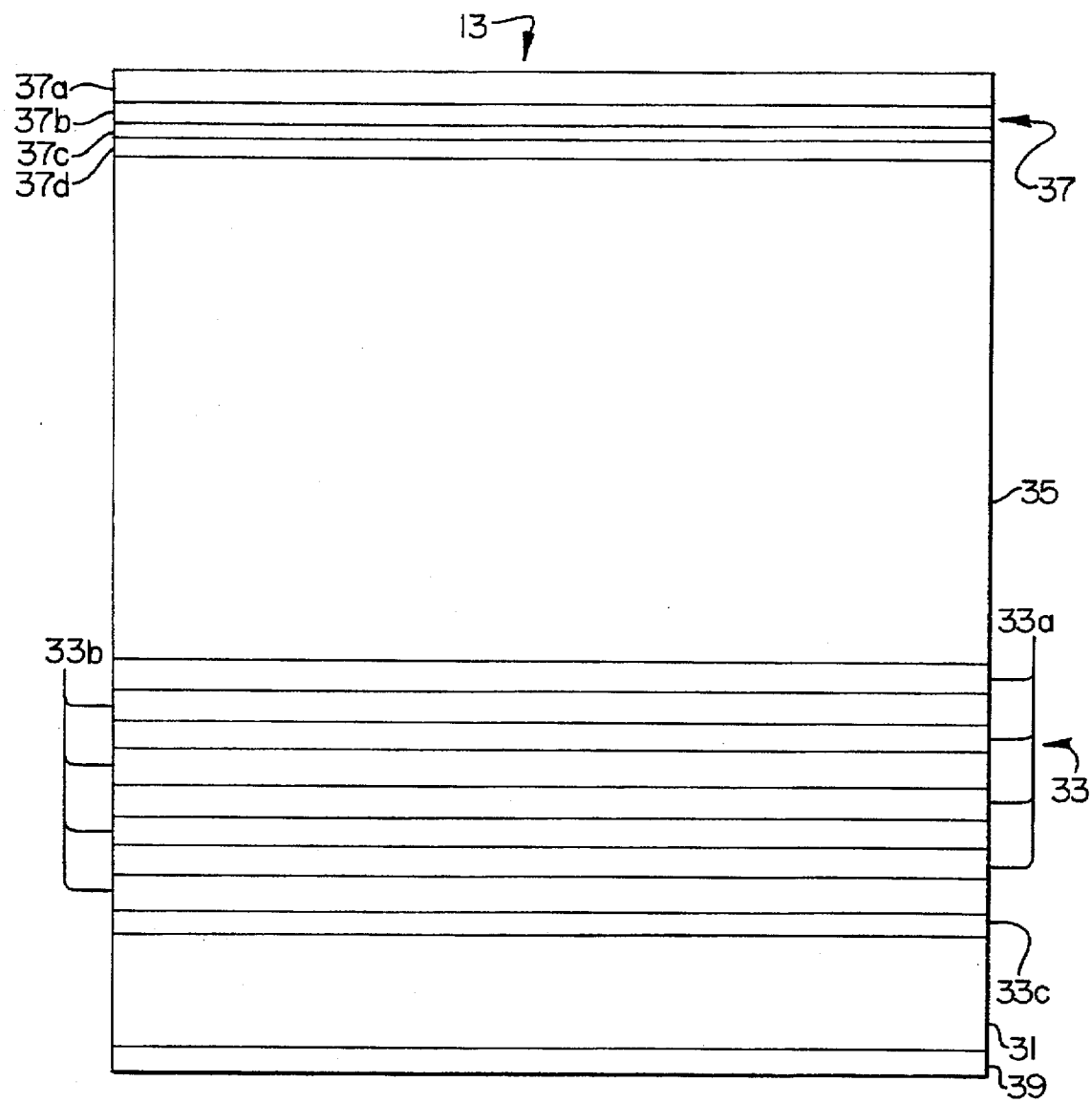
FIG. 2 is a greatly enlarged cross sectional view of the semiconductor laser screen of the electron beam pumped semiconductor laser of FIG. 1.

FIG. 2 illustrates a cross-section of the semiconductor laser screen 13 of FIG. 1 wherein the electron beam responsive active gain layer 35 is a uniform single crystal active gain layer having a crystal structure in alignment with the crystal structure of the substrate 31 and the partially reflecting/transmitting layer 33. Accordingly, the partially reflecting/transmitting layer 33 and the active gain layer 35 can be formed by epitaxial deposition techniques such as molecular beam epitaxy (MBE) or metal organic chemical vapor deposition (MOCVD) thereby eliminating the need to bond these layers or to remove a growth substrate by methods such as lapping or etching.

The substrate 31 is preferably transparent at the wavelength of the output laser beam and also able to support the epitaxial single crystal growth of the active gain layer 35. Accordingly, the substrate 31 should be a highly polished single crystal substrate with a relatively close lattice match with that of the material used for the active gain layer. For example, the substrate 31 can be a single crystal (001) oriented sapphire ($Al_2O_3$) substrate on the order of 5 mm to 10 mm thick for laser wavelengths in the visible range and active gain layers comprising type-III Nitrides. Alternately, the substrate can be a single crystal substrate of GaAs, GaP, or InP.

The partially reflecting/transmitting layer 33 is preferably an epitaxial single crystal layer with a crystal structure in alignment with the crystal structure of the substrate 31. This layer provides controlled transmission of the laser output with low absorptive loss, and provides output coupling from the vertical laser cavity which is formed by the active gain layer 35 between the partially transmitting/reflecting layer 33 and the highly reflecting layer 37.

As shown, the partially reflecting/transmitting layer 33 can be a Bragg reflector with pairs of alternating layers 33a and 33b of high and low refractive index. In particular, each pair of alternating layers can include a layer of GaN 33a (refractive index 2.5) and AlN 33b (refractive index 2.3), with each pair having a thickness equal to one quarter of the desired wavelength for the laser output. For example, each pair of layers can have a thickness of 1125 Angstroms for a blue (approximately 450 nm wavelength) laser output; 1375 Angstroms for a green (approximately 550 nm wavelength) laser output; or 1625 Angstroms for a red (approximately 650 nm wavelength) laser output.

In addition, GaAlN can be used as one of the layers in each pair. While FIG. 2 shows only four quarter wavelength pairs of layers for purposes of illustration, the partially reflecting/transmitting layer 33 preferably includes as many as 18 to 20 quarter wavelength pairs of layers of GaN and AlN. In addition, the partially reflecting/transmitting layer 33 can include a lattice matching growth layer 33c such as a 100 Angstrom to 300 Angstrom layer of GaN to reduce crystal distortion in the partially reflecting/transmitting layer 33. For example, the partially reflecting/transmitting layer 33 can be a layer of GaN, GaAlN, or AlN followed by layers of GaAlN and GaN.

The electron beam responsive active gain layer 35 can be a uniform single crystal semiconductor layer of $Ga_{1-x}In_xN$, $Ga_{1-x}P_xN$, or $Ga_{1-x}Al_xN$, to obtain a laser output at the visible wavelengths, or alloys of InN, AlN, GaN, GaP, $In_{1-x}P_xN$, or $In_{1-x}As_xN$ to obtain a laser output at wavelengths beyond the visible range. The uniform single crystal semiconductor layer is preferably on the order of 1,000 nm to 20,000 nm thick. As an example, the active gain layer can be a uniform single crystal film of epitaxially grown $Ga_{1-x}In_xN$ with x≈0.4 for a blue (approximately 450 nm wavelength) laser output; with x≈0.6 to 0.7 for a green (approximately 550 nm wavelength) laser output; and with x≈0.9 for a red (approximately 650 nm wavelength) laser output.

The thickness of the active gain layer determines the electron beam voltage required for penetration as well as the heat capacity of the layer. Accordingly, a thin active gain layer reduces the electron beam voltage required thereby reducing the heat generated. A thin active gain layer also reduces the heat capacity of the laser screen thereby making it easier to cool. The ability to epitaxially grow the active gain layer on the substrate allows the production of a thin high quality active gain layer over a relatively large substrate providing a relatively large economical laser screen with a long lifetime, reduced cooling requirements, and reduced electron beam voltage.

The highly reflective layer 37 can include a thin metal layer 37a such as a silver (Ag) or aluminum (Al) layer on the order of 700 Angstroms to 900 Angstroms thick. This layer provides a conductive return path for the electron beam current preventing charging of the surface. This layer also provides a highly reflective upper surface for the vertical laser cavity. Because this layer is in the path of the electron beam, it must be relatively thin so as to not impede the penetration of the electron beam into the active gain layer. By providing a scanned electron beam and a conductive return path, there is no need to provide separate electrical connections for individual pixels on the laser screen.

The highly reflective layer 37 can also include a diffusion barrier to reduce diffusion of the metal from layer 37a into the active gain layer 35. The diffusion barrier can be a three layer structure including a first nitride layer 37b, a metal layer 37c, and a second nitride layer 37d. For example, the first nitride layer can be a 200 Angstrom thick layer of AlN, the metal layer can be a 300 Angstrom thick layer of Al, and the second nitride layer can be a 200 Angstrom thick layer of AlN.

The laser screen 13 may also include an anti-reflective layer 39 on the single crystal substrate 31 opposite the partially reflecting/transmitting layer 33. This layer reduces the reflection of the output laser beam 15 back into the laser screen thereby increasing the laser output. This anti-reflective coating can be either a layer of $SiO_2$ on the order of 1200 Angstroms thick, or a layer of AlN on the order of 1300 Angstroms thick. Either of these layers can provide a broad wavelength anti-reflective coating, which can be provided on the substrate 31 prior to the epitaxial deposition of either the partially reflecting/transmitting layer 33 or the active gain layer 35. Accordingly, the partially reflecting/transmitting layer 33 can be deposited directly on the substrate 31.

Figure 3:
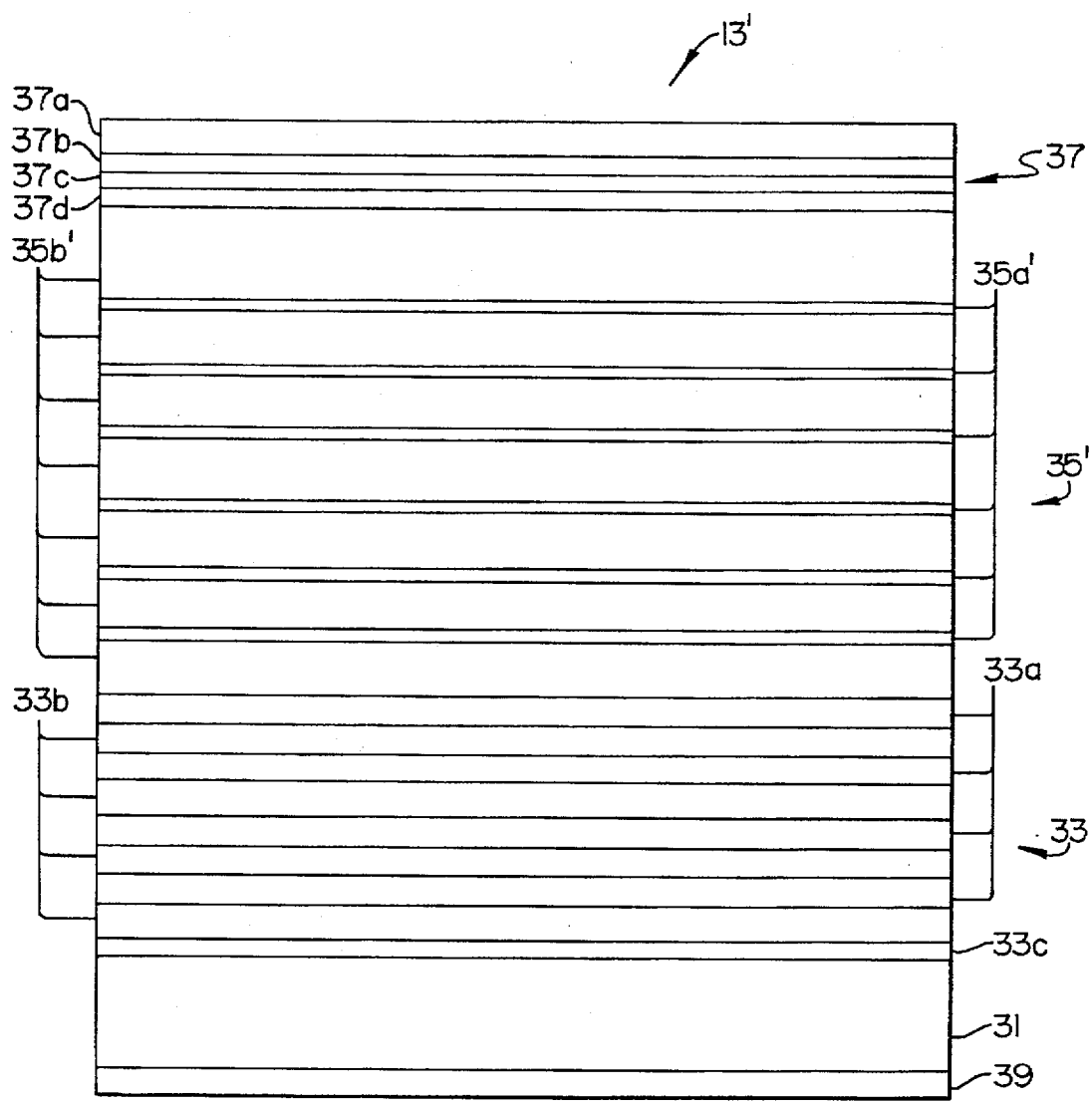
FIG. 3 ms a greatly enlarged cross sectional view of an alternate semiconductor laser screen of the electron beam pumped semiconductor laser of FIG. 1

FIG. 3 illustrates a cross-sectional view of an alternate laser screen 13' for the electron beam pumped semiconductor laser of FIG. 1. This laser screen is similar to that of FIG. 2 with the exception that the active gain layer 35' includes a plurality of quantum wells. Otherwise, the substrate 31, the partially reflecting/transmitting layer 33, the highly reflecting layer 37, and the anti-reflective layer 39 are the same as those discussed above with regard to FIGS. 1 and 2.

The active gain layer 35' can be a single crystal structure with multiple quantum wells 35a' separated by barrier layers 35b' fabricated from type-III Nitride alloys. For example, the quantum wells 35a' can be layers of $Ga_{1-x}In_xN$ on the order of 50 Angstroms to 400 Angstroms thick with $x \approx 0.4$ for a blue (approximately 450 nm wavelength) laser output, $x \approx 0.6$ to 0.7 for a green (approximately 550 nm wavelength) laser output, and $x \approx 0.9$ for a red (approximately 650 nm wavelength) laser output. The barrier layers 35b' can be GaN layers on the order of 2250 Angstroms thick for a blue (approximately 450 nm wavelength) laser output, 2750 Angstroms thick for a green (approximately 550 nm wavelength) laser output, and 3250 Angstroms thick for a red (approximately 650 nm wavelength) laser output. Accordingly, the active gain layer can be a resonant period gain structure with isolated quantum wells located at antinodes of the standing wave laser field.

Figure 4:
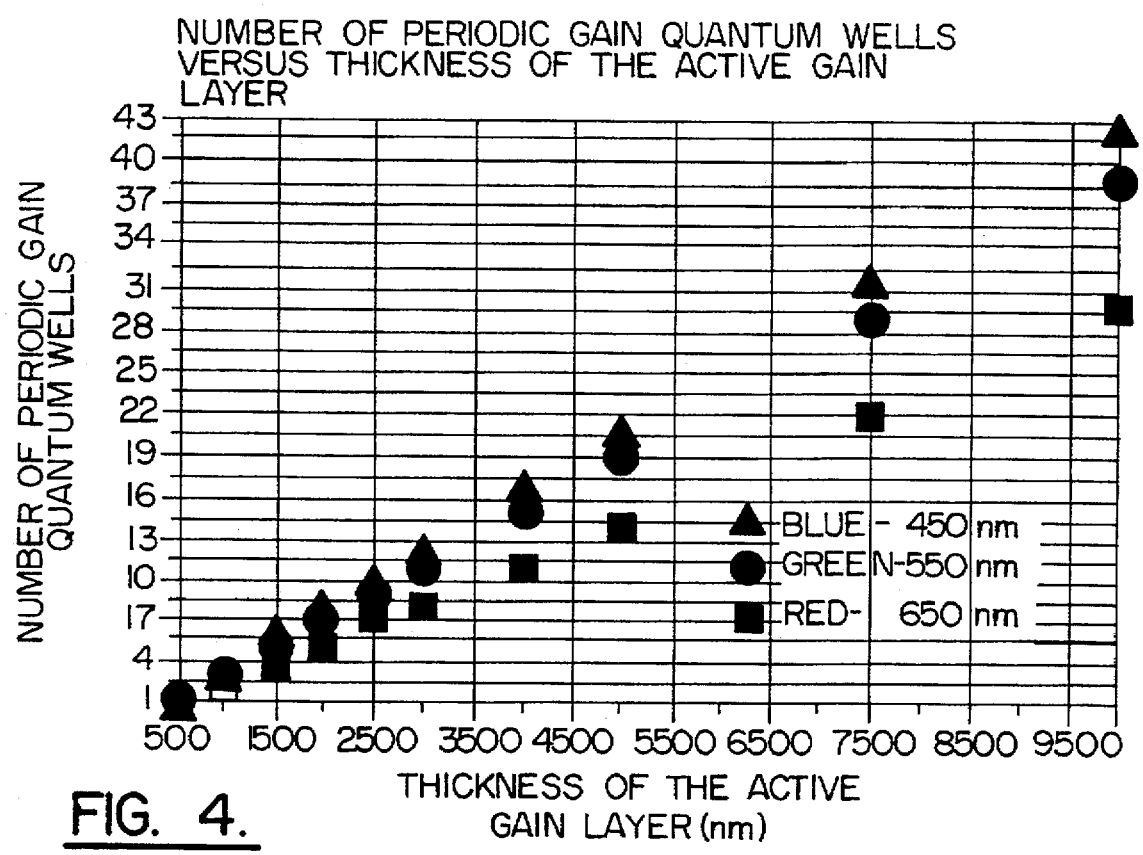
FIG. 4 is a graph of the number of periodic gain quantum wells versus thickness of the active gain layer.

The number of quantum wells 35a' for a resonant period gain structure is dependent on the thickness of the active gain layer 35'. FIG. 4 graphically illustrates the number of quantum wells which can be provided as a function of the thickness of the active gain layer 35' for three wavelengths of laser output. While FIG. 3 shows 6 quantum wells for the purpose of illustration, the active gain layer 35' preferably includes from 10 to 40 quantum wells 35a'. More preferably, the active gain layer 35' includes eighteen GaN barrier layers and seventeen 200 Angstrom thick $Ga_{1-x}In_xN$ quantum wells located at antinodes of the standing wave laser field. Alternately, the active gain region can include a multiple quantum well stack with quantum wells from approximately 50 Angstroms to 200 Angstroms thick, separated by confinement layers from approximately 200 Angstroms to 1000 Angstroms thick. In this arrangement, the quantum wells can be $Ga_{1-x}In_xN$ with GaN confinement layers.

Figure 5:
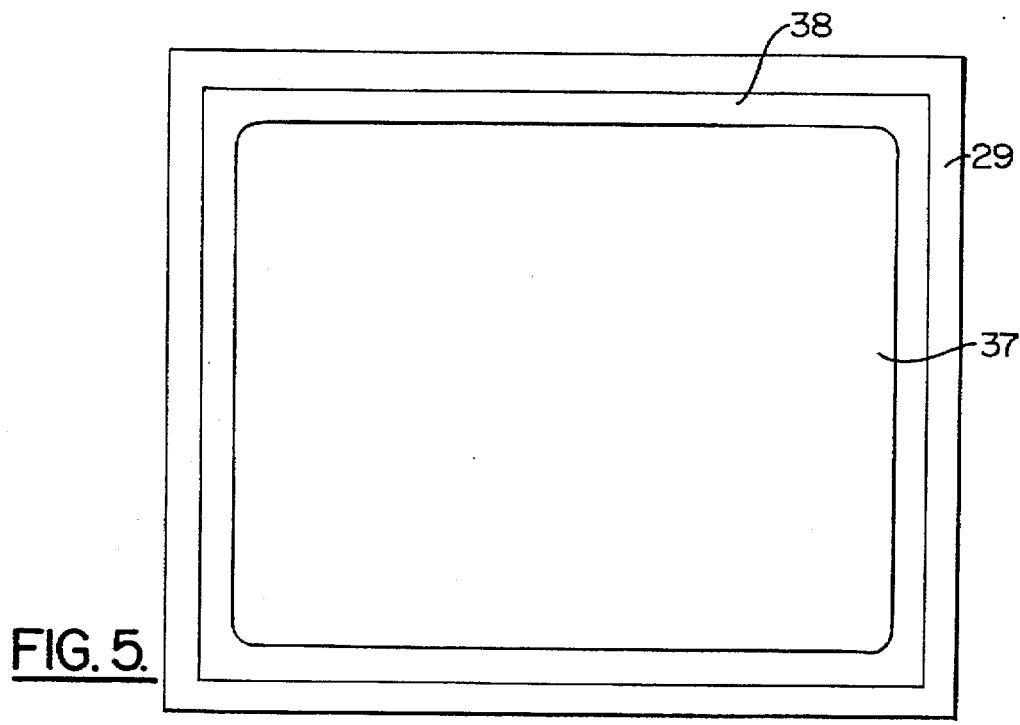
FIG. 5 is a top view of the laser screen of FIG. 1.

As illustrated in FIGS. 1 and 5, the laser screen 13 preferably includes a conductive annular edge contact 38 on the highly reflective layer 37 opposite the epitaxial active gain layer. The edge contact 38 is preferably a metal layer on the order of 0.5 to 11.0 μm thick, and the metal can be aluminum. Accordingly, the thin metal reflective layer 37 provides a conductive path allowing the charge from the electron beam 11 to dissipate without significantly impeding the penetration of the electron beam into the active gain layer 35. The thicker edge contact 38 enhances the dissipation of the charge from the electron beam by providing a less resistive path. Because the thicker contact does not cover the active area of the laser screen 13, it does not significantly affect the penetration of the electron beam 11.

Figure 6:
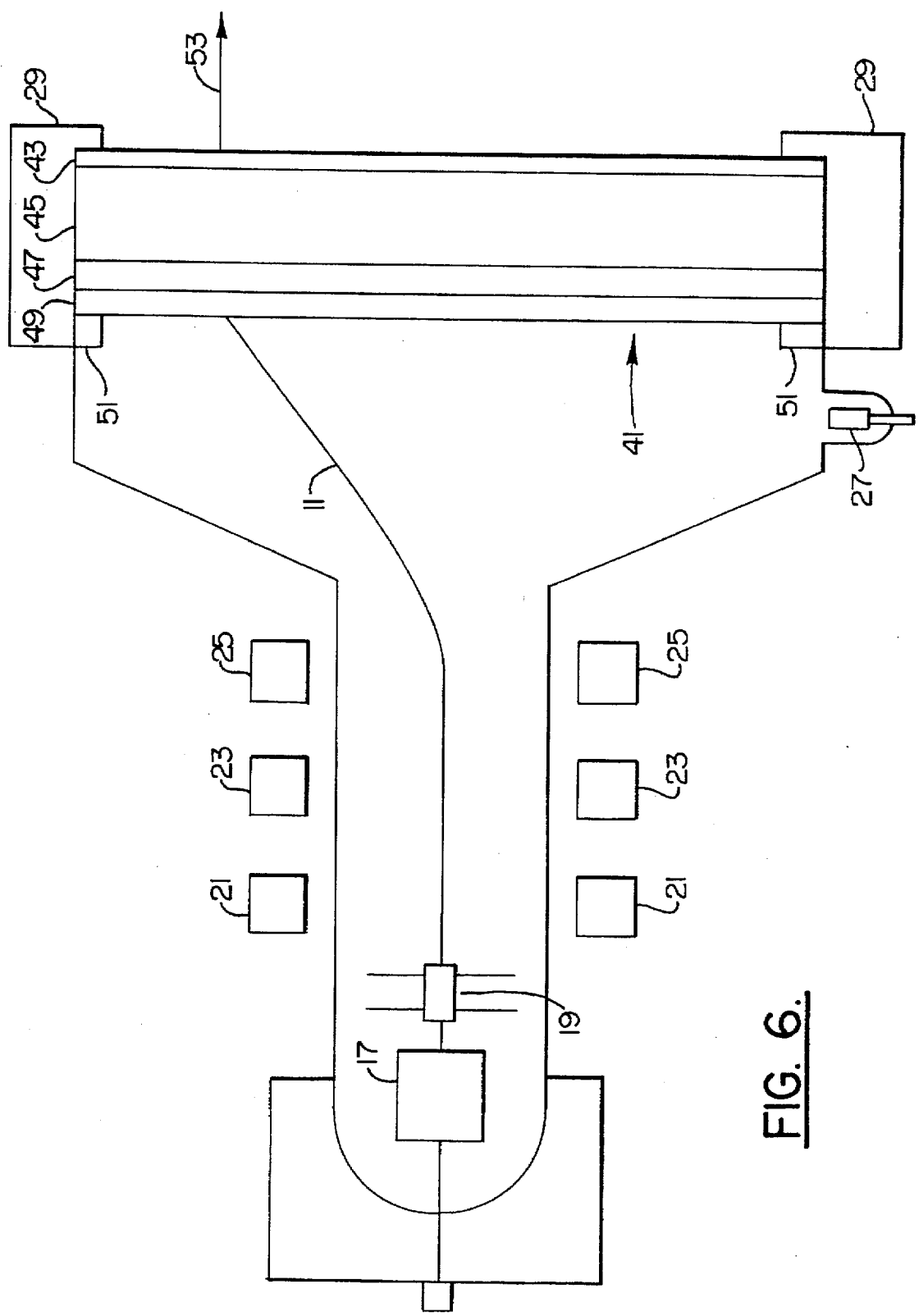
FIG. 6 is a side view of a second electron beam pumped semiconductor laser according to the present invention.

FIG. 6 illustrates an electron beam pumped semiconductor laser with a laser screen 41 wherein the partially reflecting/transmitting layer 43 is on the substrate 45 opposite the active gain layer 47. Accordingly, the epitaxial active gain layer 47 can be deposited directly on the single crystal substrate 45. Other than the laser screen 41, the electron beam pumped semiconductor laser of FIG. 6 is the same as that illustrated in FIG. 1.

As before, the substrate 45 can be a (001) oriented single crystal sapphire ($Al_2O_3$) substrate on the order of 5 mm to 10 mm thick. The partially reflecting/transmitting layer 43, however, is formed on the substrate 45 opposite the active gain layer 47. For example, the partially reflecting/transmitting layer 43 can be a stack of layers of dielectric materials such as $SiO_2$, $AlO_2$, and $TiO_2$, wherein each layer has a thickness one quarter of the wavelength of the output laser beam 53. Alternately, the partially reflecting/transmitting layer 43 can be a layer of metal such as Ag or Al.

Figure 7:
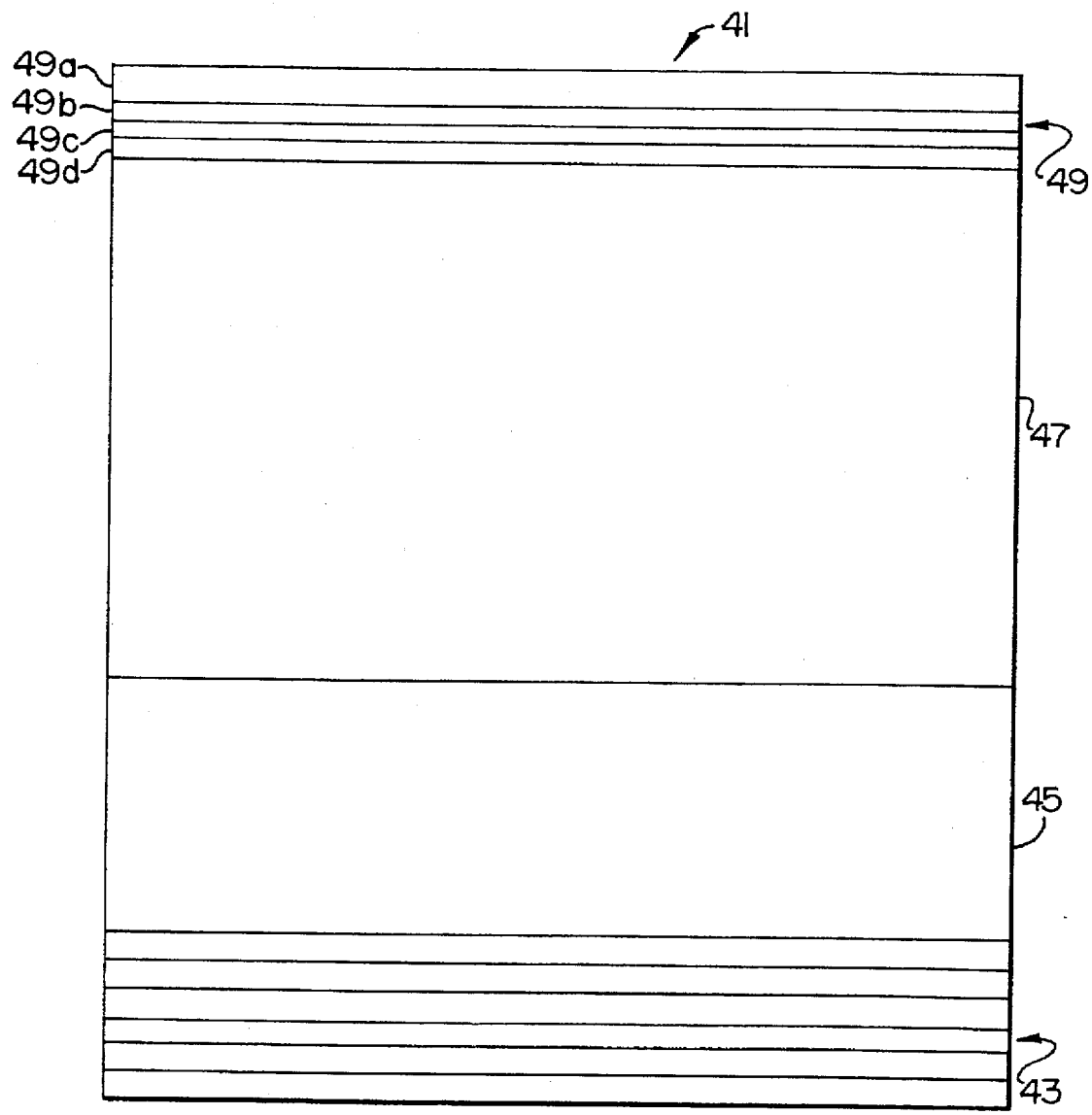
FIG. 7 is a greatly enlarged cross sectional view of the semiconductor laser screen of the electron beam pumped semiconductor laser of FIG. 6.

A cross section of the laser screen 41 is illustrated in FIG. 7. The uniform single crystal active gain layer 47 is the same as that illustrated in FIG. 2 with the exception that the active gain layer 47 is grown directly on the single crystal substrate 45. Because of the close lattice match of single crystal sapphire and $Ga_{1-x}In_xN$, the active gain layer 47 can be epitaxially grown directly on the substrate by techniques known to those having skill in the art. Because the partially reflecting/transmitting layer 43 is not between the substrate and the active gain layer, there is no need to use a material with a crystal lattice matching that of the substrate or the active gain layer or for that matter to even use a crystalline material. The highly reflecting layer 49 is the same as that illustrated in FIG. 2 with layers 49a, 49b, 49c, and 49d corresponding respectively to layers 37a, 37b, 37c, and 37d.

Figure 8:
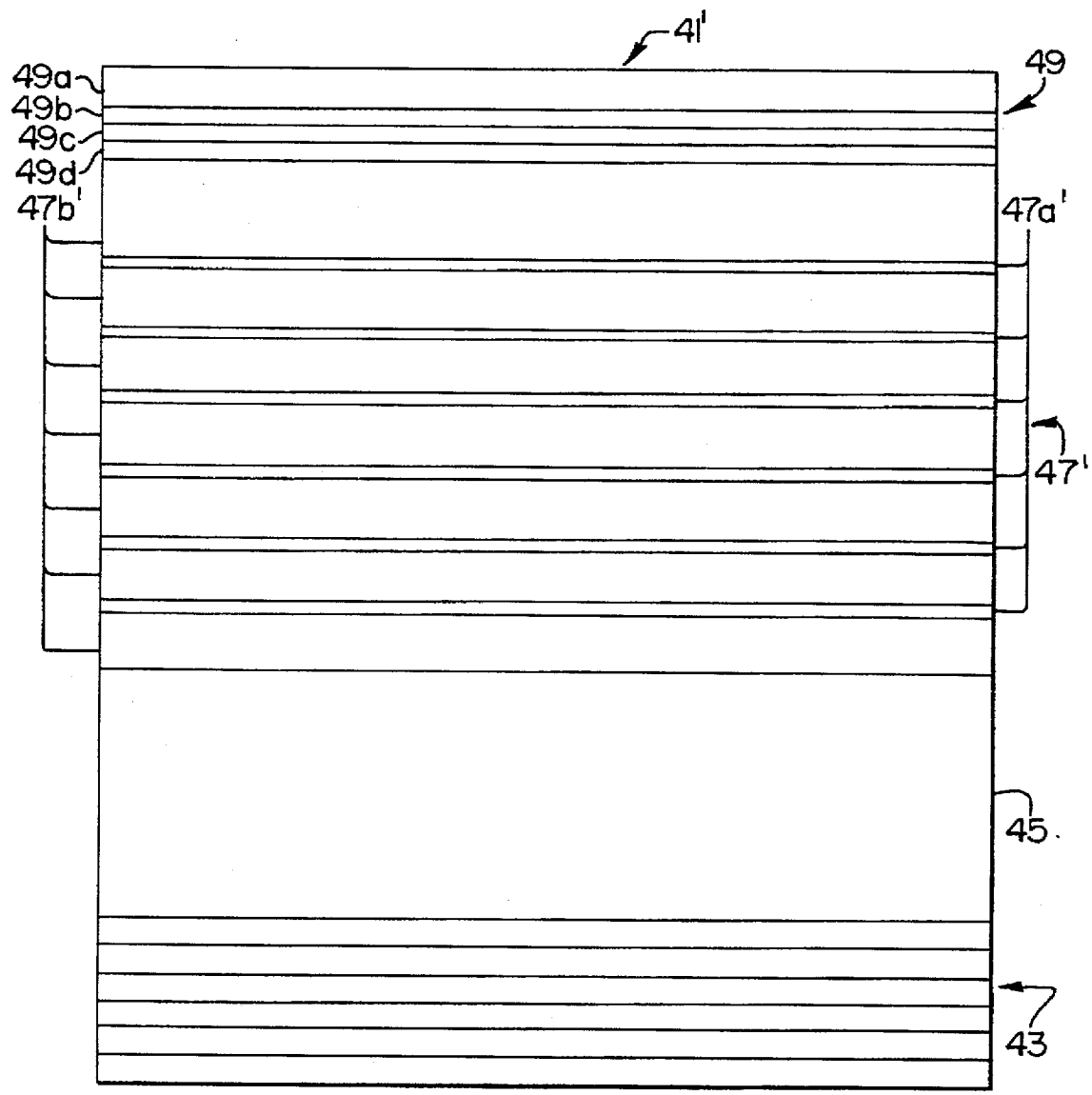
FIG. 8 is a greatly enlarged cross sectional view of an alternate semiconductor laser screen of the electron beam pumped semiconductor laser of FIG. 6.

FIG. 8 illustrates an alternate cross section of the laser screen of FIG. 6. This cross section is the same as that of FIG. 7 with the exception that the single crystal active gain layer includes a plurality of quantum wells 47a' separated by barrier layers 47b'. The use of quantum wells and barrier layers is discussed above in detail with regard to FIG. 3 wherein layers 47a' and 47b' correspond respectively to layers 35a' and 35b'.

The laser screens of the electron beam pumped semiconductor lasers of FIGS. 1 and 6 can be efficiently produced as monolithic laser screens. That is, each layer can be deposited on the single crystal substrate without the need for costly and unreliable processing steps such as wafer bonding and wafer lapping or etching. In particular, the laser screen is preferably produced by depositing each of the layers directly on the single crystal substrate.

A single crystal sapphire substrate 31 provides adequate mechanical strength for the growth of the subsequent layers as well for providing a vacuum window. The single crystal sapphire substrate 31 also provides a growth surface for the epitaxial growth of the partially reflecting/transmitting layer 33 and the active gain layer 35. Accordingly, these layers can be grown by epitaxial growth techniques known to those having skill in the art such as metal organic chemical vapor deposition (MOCVD) or molecular beam epitaxy (MBE). These growth techniques can provide thin layers with uniform thickness and composition over a substrate having a large surface area. These techniques also produce thin layers with low defect densities thereby reducing variations in the laser output as it is scanned across the resulting laser screen.

The electron beam pumped semiconductor laser of FIG. 1 can be produced by forming an epitaxial reflective layer 33, such as a Bragg reflector on a single crystal sapphire substrate 31. Accordingly, this reflective layer has a crystal structure in alignment with the crystal structure of the substrate. An epitaxial electron beam responsive active gain layer 35 is then formed on the epitaxial reflective layer so that the epitaxial active gain layer has a crystal structure in alignment with the crystal structure of both the reflective layer and the substrate. These epitaxial deposition steps provide thin single crystal layers with uniform thickness and composition across a relatively large surface area.

A highly reflective metal layer 37 is then formed on the active layer to define a laser cavity through the epitaxial electron beam responsive active gain layer. This layer can be provided by methods known to those having skill in the art such as evaporation or sputtering. The reflective metal layer also provides a return path for the electron beam current. In addition, a conductive annular edge contact 38 can be formed on the reflective metal layer 37 extending along an outer portion of the laser screen 13. The laser screen can then be assembled with an electron beam source and sealed to produce a vacuum tube therebetween.

Alternately, the epitaxial electron beam responsive active gain 47 layer can be epitaxially deposited directly on the sapphire substrate 45, with the partially reflecting/transmitting layer 43 on the substrate opposite the active gain layer as shown in FIG. 6. Accordingly, the active gain layer is grown directly on the substrate, and the partially reflecting/transmitting layer is not required to be single crystal or to have a crystal lattice matching that of either the substrate or the active gain layer.

In the drawings and specification, there have been disclosed typical preferred embodiments of the invention, and although specific terms are employed, they are used in a generic and descriptive sense only and not for purposes of limitation, the scope of the invention being set forth in the following claims.

That which is claimed:

1. A semiconductor laser screen for generating a laser output in response to an electron beam impinging thereon, said semiconductor laser screen comprising:

a single crystal substrate having a predetermined crystal structure;

an epitaxial electron beam responsive active gain layer on said single crystal substrate, wherein said epitaxial active gain layer has a crystal structure in alignment with said predetermined crystal structure of said substrate;

a first reflective layer on said active gain layer opposite said single crystal substrate; and a second reflective layer on said single crystal substrate thereby defining a laser cavity through said epitaxial active gain layer between said first reflective layer and said second reflective layer.

2. A semiconductor laser screen according to claim 1 wherein said second reflective layer comprises an epitaxial reflective layer between said single crystal substrate and said epitaxial active gain layer, wherein said epitaxial reflective layer has a crystal structure in alignment with said predetermined crystal structure of said substrate.

3. A semiconductor laser screen according to claim 2 wherein said second reflective layer comprises a Bragg reflector with alternating layers of high and low refractive index.

4. A semiconductor laser screen according to claim 2 further comprising an anti-reflective layer on said single crystal substrate opposite said second reflective layer.

5. A semiconductor laser screen according to claim 2 further comprising a lattice matching growth layer between said single crystal substrate and second reflective layer.

6. A semiconductor laser screen according to claim 1 wherein said second reflective layer is on said single crystal substrate opposite said epitaxial active gain layer.

7. A semiconductor laser screen according to claim 1 wherein said epitaxial active gain layer comprises a uniform single crystal.

8. A semiconductor laser screen according to claim 1 wherein said epitaxial active gain layer comprises a plurality of quantum wells.

9. A semiconductor laser screen according to claim 1 further comprising a conductive annular edge contact on said first reflective layer opposite said epitaxial active gain layer extending along an outer portion of said laser screen.

10. A semiconductor laser screen according to claim 1 wherein the electron beam impinges on said first reflective layer and said active gain layer, said single crystal substrate is transparent to the laser output, and said second reflective layer is partially transmitting so that the laser output exits the semiconductor laser screen opposite the electron beam.

11. An electron beam pumped semiconductor laser comprising:

a semiconductor laser screen comprising a single crystal substrate having a predetermined crystal structure, an epitaxial electron beam responsive active gain layer on said single crystal substrate, wherein said epitaxial electron beam responsive active gain layer has a crystal structure in alignment with said predetermined crystal structure of said substrate, a first reflective layer on said active gain layer opposite said single crystal substrate, and a second reflective layer on said single crystal substrate thereby defining a laser cavity through said epitaxial electron beam responsive active gain layer between said first reflective layer and said second reflective layer; and an electron beam source adjacent said semiconductor laser screen for generating an electron beam to impinge on said epitaxial electron beam responsive active gain layer thereby generating a laser output.

12. An electron beam pumped semiconductor laser according to claim 11 wherein said second reflective layer comprises an epitaxial reflective layer between said single crystal substrate and said epitaxial active gain layer, wherein said epitaxial reflective layer has a crystal structure in alignment with said predetermined crystal structure of said substrate.

13. An electron beam pumped semiconductor laser according to claim 12 wherein said second reflective layer comprises a Bragg reflector with alternating layers of high and low refractive index.

14. An electron beam pumped semiconductor laser according to claim 12 wherein said semiconductor laser screen further comprises an anti-reflective layer on said single crystal substrate opposite said second reflective layer.

15. An electron beam pumped semiconductor laser according to claim 12 wherein said semiconductor laser screen further comprises a lattice matching growth layer between said single crystal substrate and second reflective layer.

16. An electron beam pumped semiconductor laser according to claim 11 wherein said second reflective layer is on said single crystal substrate opposite said epitaxial active gain layer.

17. An electron beam pumped semiconductor laser according to claim 11 wherein said epitaxial active gain layer comprises a uniform single crystal.

18. An electron beam pumped semiconductor laser according to claim 11 wherein said epitaxial active gain layer comprises a plurality of quantum wells.

19. An electron beam pumped semiconductor laser according to claim 11 wherein said laser screen further comprises a conductive annular edge contact on said first reflective layer opposite said epitaxial active gain layer extending along an outer portion of said laser screen.

20. An electron beam pumped semiconductor laser according to claim 11 wherein the electron beam impinges on said first reflective layer and said active gain layer, said single crystal substrate is transparent to the laser output, and said second reflective layer is partially transmitting so that the laser output exits said semiconductor laser screen opposite the electron beam.

* * * * *